(12) United States Patent
Brist

(10) Patent No.: US 9,872,397 B2
(45) Date of Patent: Jan. 16, 2018

(54) SYMMETRICAL HEXAGONAL-BASED BALL GRID ARRAY PATTERN

(71) Applicant: INTEL CORPORATION, Santa Clara, CA (US)

(72) Inventor: Gary Brist, Yamhill, OR (US)

(73) Assignee: Intel Corporation, Santa Clara, CA (US)

(*) Notice: Subject to any disclaimer, the term of this patent is extended or adjusted under 35 U.S.C. 154(b) by 478 days.

(21) Appl. No.: 13/705,747

(22) Filed: Dec. 5, 2012

(65) Prior Publication Data

US 2014/0153172 A1 Jun. 5, 2014

(51) Int. Cl.
*H05K 3/34* (2006.01)
*H01L 23/498* (2006.01)
*H05K 1/11* (2006.01)

(52) U.S. Cl.
CPC ..... *H05K 3/3436* (2013.01); *H01L 23/49816* (2013.01); *H01L 23/49838* (2013.01); *H01L 2924/0002* (2013.01); *H05K 1/111* (2013.01); *H05K 2201/09227* (2013.01); *H05K 2201/10734* (2013.01); *Y02P 70/613* (2015.11); *Y10T 29/49155* (2015.01)

(58) Field of Classification Search
CPC ............ H05K 3/3436; H01L 23/49838; H01L 23/49816; H01L 23/528; H01L 23/538
See application file for complete search history.

(56) References Cited

U.S. PATENT DOCUMENTS

| 5,578,840 | A  | * | 11/1996 | Scepanovic et al. ......... 257/207 |
| 5,777,360 | A  | * | 7/1998  | Rostoker et al. ............. 257/315 |
| 6,407,434 | B1 | * | 6/2002  | Rostoker ............ G06F 17/5072 |
|           |    |   |         | 257/207 |
| 6,498,731 | B1 | * | 12/2002 | Roscoe et al. ................. 361/796 |
| 6,756,666 | B2 | * | 6/2004  | Hosomi ......................... 257/693 |
| 8,830,679 | B2 | * | 9/2014  | Scholeno ...................... 361/711 |
| 2004/0178250 | A1 | * | 9/2004 | Cherian ..................... 228/180.1 |
| 2005/0087886 | A1 | * | 4/2005 | Leinbach ...................... 257/786 |
| 2005/0186769 | A1 | * | 8/2005 | Young .......................... 438/612 |
| 2005/0263884 | A1 | * | 12/2005 | Sawada ......................... 257/737 |
| 2006/0049468 | A1 | * | 3/2006 | Cheng et al. ................... 257/401 |
| 2007/0164445 | A1 | * | 7/2007 | Ejima ........................... 257/777 |
| 2009/0114436 | A1 | * | 5/2009 | Chen ................ H01L 23/49811 |
|           |    |   |         | 174/263 |
| 2009/0146318 | A1 | * | 6/2009 | Horiuchi et al. ............. 257/778 |
| 2011/0151627 | A1 | * | 6/2011 | Graf et al. .................... 438/121 |
| 2012/0068335 | A1 | * | 3/2012 | Song ............................ 257/737 |
| 2013/0211776 | A1 | * | 8/2013 | Grivna ......................... 702/150 |
| 2013/0256921 | A1 | * | 10/2013 | Huang et al. ................. 257/786 |
| 2013/0333933 | A1 | * | 12/2013 | Mantiply et al. ............. 174/261 |
| 2014/0140027 | A1 | * | 5/2014 | Enriquez Shibayama et al. .......... 361/773 |

* cited by examiner

*Primary Examiner* — David M Sinclair
*Assistant Examiner* — Robert Brown
(74) *Attorney, Agent, or Firm* — International IP Law Group, P.L.L.C.

(57) ABSTRACT

The present disclosure provides techniques for creating a symmetrical ball grid array pattern for an integrated circuit package. The ball grid array includes a symmetrical pattern of circuit connection points, wherein the symmetrical pattern is derived from a base hexagonal pattern that is repeated in at least one or more sections of the ball grid array.

26 Claims, 5 Drawing Sheets

100

SYMMETRICAL HEXAGONAL-BASED BALL GRID ARRAY PATTERN

TECHNICAL FIELD

The present invention relates to ball grid array (BGA) patterns. More specifically, the present invention relates to a hexagonal-based BGA pattern that is symmetric.

BACKGROUND

Integrated circuits are typically placed in a protective packaging that is mounted to a printed circuit board (PCB). One type of integrated circuit packaging is a ball grid array (BGA) package. BGA packages have a plurality of solder balls located on a bottom external surface of a package substrate. The solder balls are reflowed to attach the package to the PCB. In this manner, the integrated circuit may conduct electrical signals to the PCB and receive signals from the PCB.

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

Figure 1:
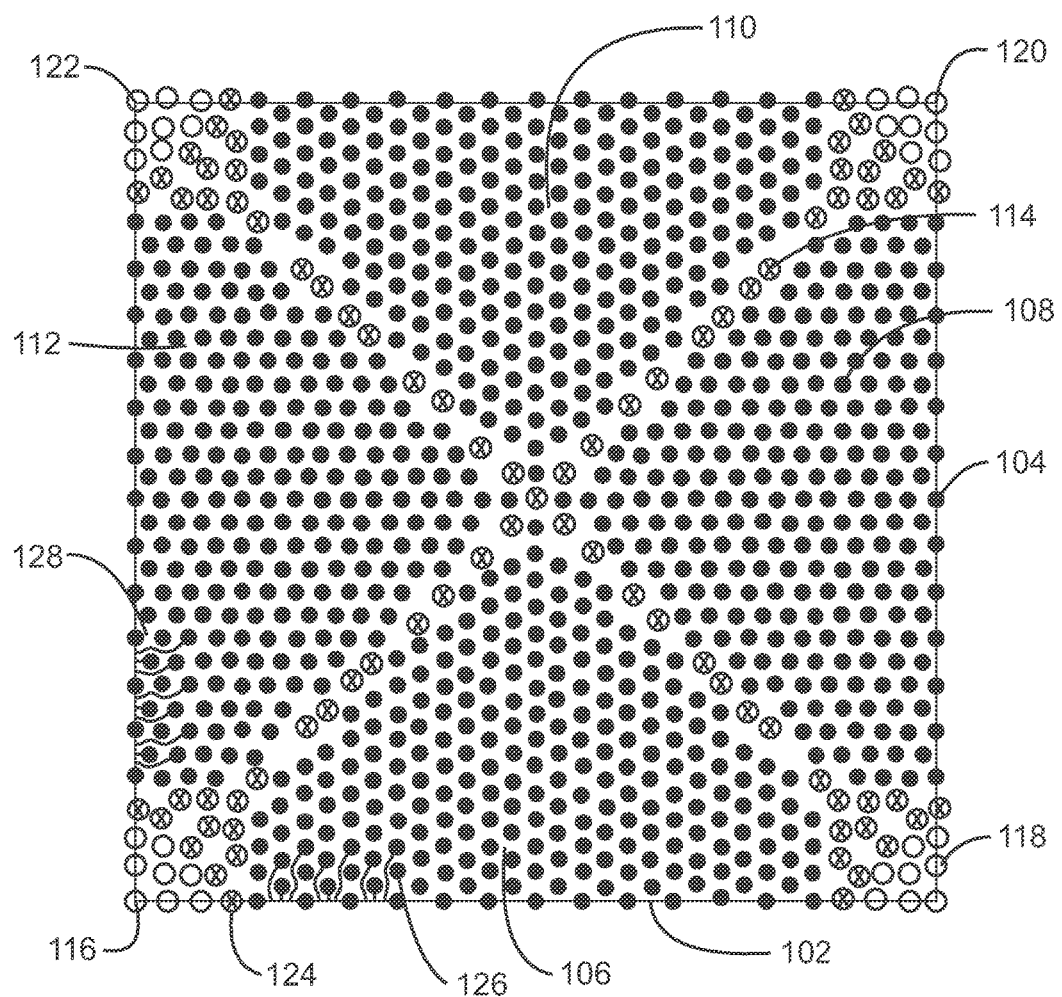
FIG. 1 is an illustration of an example of a symmetrical pattern derived from a hexagonal pattern, in accordance with embodiments.

Embodiments disclosed herein provide techniques for generating a symmetrical hexagonal ball grid array (BGA) pattern. BGA patterns may occur in various shapes, including, but not limited to rectangular patterns, such as square patterns, hexagonal patterns, and face-centered patterns. In a square pattern, each of four balls in the interior of the BGA are equidistant and the four balls in the corners are further away by a factor of $\sqrt{2}$. In addition, the pitch in the X-axis is equal to the pitch in the Y-axis. Rectangular and square patterns provide a high level of symmetry with the same minimum distance between each ball, but a lower level of single layer escape routing when compared to other BGA patterns. Single layer escape routing refers to the number of traces exiting the perimeter of the pattern. Traces are sections of metal, such as wires, which physically connect a pad to which a BGA ball is attached to another device, and provide inputs and outputs (I/Os) that electrically connect the integrated circuit packaging to other devices on the printed circuit board (PBC) via the BGA pattern. As integrated circuits become more complex, the number of I/Os to the integrated circuits increases. A symmetric BGA pattern, such as the square pattern, enables single layer escape routing to be implemented in a uniform fashion. Face-centered patterns provide symmetry and a similar amount of single layer escape routing as a hexagonal pattern. Face centered patterns may include square face centered patterns and non-square face centered patterns, such as rectangular face centered patterns. In a square face centered pattern, each ball in the interior of the BGA is equidistant to four other balls that surround the ball at forty-five degrees, one hundred thirty-five degrees, two hundred-twenty five degrees, and three hundred fifteen degrees. Face-centered patterns can provide 8-10% more escape routes than square patterns. However, the ball density of a face-centered pattern is typically less than that of a square pattern. The reduction in ball density reduces the possible number of escape routes, and thus the number of connections available to electrical devices. Furthermore, face-centered patterns typically contain less escape routes in comparison to square patterns due to losses at the edges of the face-centered pattern. However, when the area allocated for the pattern is sufficiently large so that there exists a large number of available BGA balls, the face centered pattern may provide a greater ability for escape routes.

Hexagonal patterns provide the highest density of BGA balls for a given area when compared to a square or face centered pattern. Generally, in a hexagonal pattern, a ball in the interior of the BGA is equidistant to six other balls. However, a hexagonal pattern In particular, hexagonal patterns can provide approximately 1.15 times more ball density than the square BGA pattern as discussed above. In addition, hexagonal patterns provide 8-10% higher escape routing than square patterns at the same minimum distance between BGA balls, similar to face-centered patterns. However, hexagonal patterns are not symmetrical. Because the patterns in each corner are not identical, the pattern in the corner will by diagonally symmetrical, but not symmetrical in the horizontal or vertical axis. Therefore, the mechanical stresses experienced by balls placed in the corners of the patterns are not symmetrical. This makes the stresses on the package complicated, difficult to model, and difficult to manage. In addition, the lack of symmetry of the hexagonal pattern may impact electrical breakout patterns. The electrical breakout patterns are the patterns showing how traces exit the pattern. In particular, the number and sharpness of jogs, or bends, experienced by traces as they maneuver through the pattern to the pattern's perimeter may be increased, thus increasing the length of the trace. As such, the electrical performance of the trace may be adversely affected.

Embodiments described herein disclose a hexagonal based pattern for a BGA package. The hexagonal based pattern may be modified to reduce mechanical stresses. Moreover, the hexagonal based pattern may reduce the number and sharpness of jogs and bends of the trace. Although the present techniques are described using a ball grid array, the present techniques may be applied to any type of mounting used for integrated circuit packages.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments of the inventions. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

FIG. 1 is an illustration of a symmetrical pattern 100 derived from a hexagonal pattern, in accordance with embodiments. The symmetrical pattern 100 may be included in a ball grid array package. A ball grid array package may have a top surface and a bottom surface. An array of contact pads may be arranged on the bottom surface of the substrate. A plurality of solder balls may be attached to the contact pads. The contact pads and solder balls may be arranged in a pattern, such as symmetrical pattern 100.

The symmetrical pattern 100 may have a pattern perimeter 102. The pattern perimeter 102 may have the same shape as the final shape of the package. In an example, the package may be a square shape. In another example, the package may be a non-square shape, such as a rectangle, a triangle, or a circle.

The package may be divided into at least one or more portions. The portions of the package may contain a plurality of circuit connection points 104 disposed within the pattern perimeter 102. The circuit connection points 104 may be solder balls of a ball grid array. In another example, the circuit connection points 104 may be contact pads. In another example, the circuit connection points 104 may be solder balls in contact with contact pads.

The circuit connection points 104 may be arranged in a symmetrical pattern 100. In particular, the circuit connection points 104 may be arranged in a symmetrical hexagonal pattern. The symmetrical hexagonal pattern may include a plurality of hexagonal patterns 106, 108, 110, and 112, with each hexagonal pattern contained in a portion of the package. While the symmetrical pattern 100 includes four hexagonal patterns for a package divided into four portions, any number of hexagonal patterns may included in the symmetrical pattern 100. In another example, the symmetrical pattern 100 may include eight hexagonal patterns. The hexagonal patterns 106, 108, 110, and 112 may be repeated between the portions of the package shape such that the hexagonal patterns 106, 108, 110, and 112 are exact copies of each other. In another example, the hexagonal patterns 106, 108, 110, and 112 may be modified to fit differently shaped portions of the package shape.

The hexagonal patterns 106, 108, 110, and 112 may be arranged such that patterns in portions positioned directly opposite each other are mirror images. The hexagonal patterns 106, 108, 110, and 112 may be further positioned such that adjoining hexagonal patterns are rotated ninety degrees in relation to each other when travelling clockwise around the symmetrical pattern 100. Further, the hexagonal patterns 106, 108, 110, and 112 may be further positioned such that the hexagonal patterns 106, 108, 110, and 112 do not touch each other. Adjoining hexagonal patterns may be separated by a predetermined distance. For example, the hexagonal patterns may be separated by the pitch of the pattern. Pitch refers to the distance from the center of one circuit connection point to the center of another circuit connection point.

The circuit connection points 114 are represented by a circle with an X inside the circle. The circuit connection points 114 may not part of the portion of the hexagonal patterns discussed above. Rather, the circuit connection points 114 may be positioned between the hexagonal patterns 106, 108, 110, and 112, such that a minimum spacing is observed between the added circuit connection points 114 and the circuit connection points 104 of the hexagonal patterns 106, 108, 110, and 112. The minimum spacing may be determined by a designer. Circuit connection points 114 may further be positioned to maintain a minimum spacing between the added circuit connection points 114. A circuit connection point may not be added in a particular area of the space between the hexagonal patterns 106, 108, 110, and 112 if the minimum spacing will not be observed.

Additionally, the pattern 100 may include corner patterns 116, 118, 120, and 122. The circuit connection points of the corner patterns are shown in FIG. 1 as circles with a white interior. In examples, the corner patterns 116, 118, 120, and 122 may be extensions of the hexagonal patterns 106, 108, 110, and 112. In another example, the circuit connection points within the corner patterns 116, 118, 120, and 122 may be arranged in a pattern other than the hexagonal patterns 106, 108, 110, and 112. For example, the corner patterns 116, 118, 120, and 122 may be solder joint reliability (SJR) patterns. SJR patterns may be patterns designed to create particular mechanical stresses. Mechanical stresses may develop at various points during manufacturing a PCB with attached circuit packages, such as during heating and cooling of an integrated circuit package during joining. In an example, the corner patterns 116, 118, 120, and 122 may all be the same pattern. In another example, the patterns 116, 118, 120, and 120 may be different patterns, such as to allow for different corner shapes. Circuit connection points 124 may be arranged between the corner patterns 116, 113, 120, and 122 and the hexagonal patterns 106, 108, 110, and 112. The circuit connection points 124 may be arranged such that a minimum spacing is maintained. The minimum spacing may be the same as the minimum spacing maintained with the addition of circuit connection points 114. In another example, the minimum spacing may differ from the minimum spacing maintained with the addition of circuit connection points 114.

The pattern 100 may be generated such that the pattern is symmetrical. In particular, the circuit connection points around the perimeter 102 of the pattern 100 may be positioned at a predetermined distance from each other. The distance between circuit connection points may be maintained around the entire perimeter 102 of the pattern 100. The maintenance of the distance between circuit connection points creates a regular shape with no losses at the edges. Losses refer to the removal or absence of a BGA ball. Removing BGA balls can be utilized to increase escape routing in a localized area. However, removing BGA balls will reduce the mechanical attachment of the package to the PCB and later the stresses during thermal cycling and mechanical shock.

A ball grid array package, such as the ball grid array package that includes the symmetrical pattern 100, may be included in a system such as the computing device 400 described below in FIG. 4. The system may include a PCB with various electrical connections and components. An integrated circuit package, such as the ball grid array package described above, may be coupled to the PCB. The integrated circuit package may be coupled to the printed circuit board via solder balls arranged in a ball grid array pattern, such as symmetrical pattern 100.

Traces, such as traces 126 and 128, may be positioned between the circuit connection points of pattern 100. The traces may be included on a PCB. The traces of the PCB electrically connect a ball grid array package which includes the symmetrical pattern 100 to other devices using the PCB. The traces may each contact a single circuit connection point within pattern 100. The traces 126 and 128 may exit the pattern perimeter 102 without contacting any circuit connection points other than the circuit connection point to which the trace 126 and 128 is connected. The number of traces 126 and 128 to exit the perimeter 102 is the escape density or escape routing of the pattern 100. The electrical performance of the traces may be affected by a number of factors, such as the jogs (the number of bends to weave through the pattern), the length of the traces, the number of traces moving between particular circuit connection points, and the proximity of traces to each other. The regularity of the perimeter 102 of pattern 100 may improve the electrical performance of the traces, such as by increasing the uniformity of the number and sharpness of jogs between portions of the package.

Figure 2:
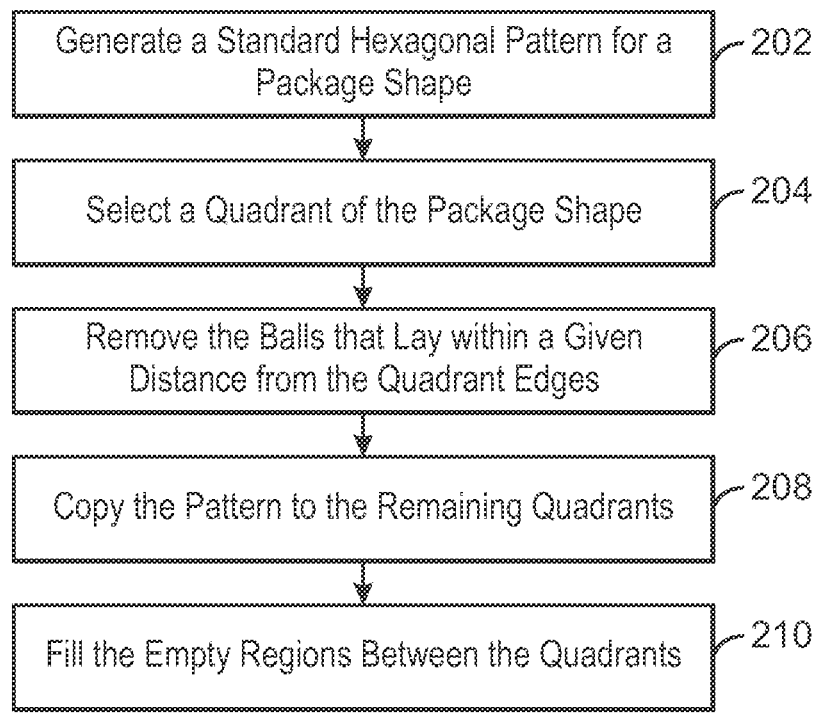
FIG. 2 is a process flow diagram showing a method of generating a symmetrical pattern derived from a hexagonal pattern, in accordance with embodiments.

FIG. 2 is a process flow diagram showing a method of generating a symmetrical pattern derived from a hexagonal pattern. At step 202, a portion of a package may be selected. The package may be an integrated circuit package as discussed above. In an example, the portion of the package may be selected based on the width of the outward facing pitch (P). For example, the portion may be the portion with the wider outward facing pitch (P). At step 204, a hexagonal pattern is placed in the selected portion of the package. In embodiments, the hexagonal pattern may be copied to all portions of the package.

At step 206, the circuit connection points that are within a predetermined distance to an edge of the portion may be removed. In embodiments, the distance may be determined using the I/O capacity of the integrated circuit within the package. For example, a particular integrated circuit may use less than the maximum number of I/Os provided by the circuit connection points, thereby enabling removal of circuit connection points. Additionally, in embodiments, the distance may be determined in accordance with material constraints. For example, the materials used to for the package may limit the number of circuit connection points as well as their distance to the edge of the package and other circuit connection points. Moreover, the distance may be determined using design constraints or manufacturing limitations. At step 208, a region of the portion may be filled with additional circuit connection points. In embodiments, the additional circuit connection points may be selected such that the pitch between surrounding circuit connection points is satisfied. Additionally, in embodiments, the additional circuit connection points may be added to regions with respect to circuit connection points of a first portion and circuit connection points of a second portion. In this manner, the additional circuit connection points between portions of the circuit package may satisfy any constraints and pitch.

Figure 3A:
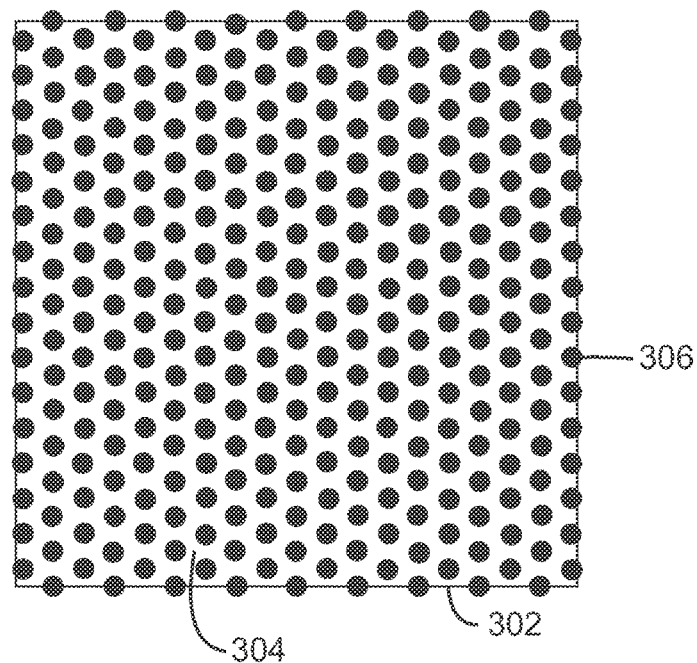
FIG. 3A is an illustration of an example of a standard hexagonal pattern for a package shape, in accordance with embodiments.

FIG. 3A is an illustration of a hexagonal pattern for a package shape, in accordance with embodiments. The hexagonal pattern 302 may be placed in a selected portion of a package. In embodiments, the hexagonal pattern 302 may be designed to fit a particular package shape 304. Additionally, the hexagonal pattern 302 may have a desired pitch P. Circuit connection points 306 may be arranged in the hexagonal pattern 302.

Figure 3B:
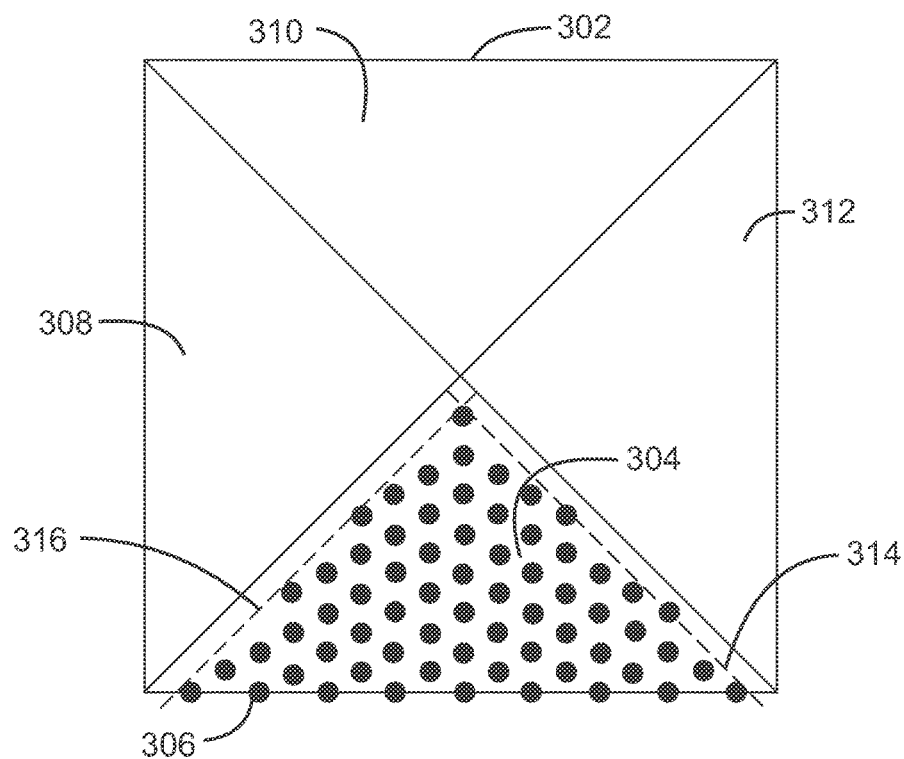
FIG. 3B is an illustration of a selected section of a package shape, in accordance with embodiments.

FIG. 3B is an illustration of a selected portion 314 of a package shape. The hexagonal pattern 302 may be used to fill in the selected portion 314. In embodiments, the package may be divided into additional portions, such as portions 308, 310, and 312. The selected portion 314 may be the section with the widest outward facing pitch P. A line of demarcation 316 running along the inner edges of the portion 314 which marks the point beyond which any circuit connection points 306 are removed. The line of demarcation 316 may lie at a predetermined distance from the inner edges of the section as discussed above. For example, the line of demarcation 316 may be positioned at half of the pitch (0.5P) of from the inner edges of the section. In another example, the line of demarcation 316 may be positioned at distance of 1.0P from the inner edges of the section. In a further example, the line of demarcation 316 may be positioned at a 0.25P from the inner edges of the section.

Figure 3C:
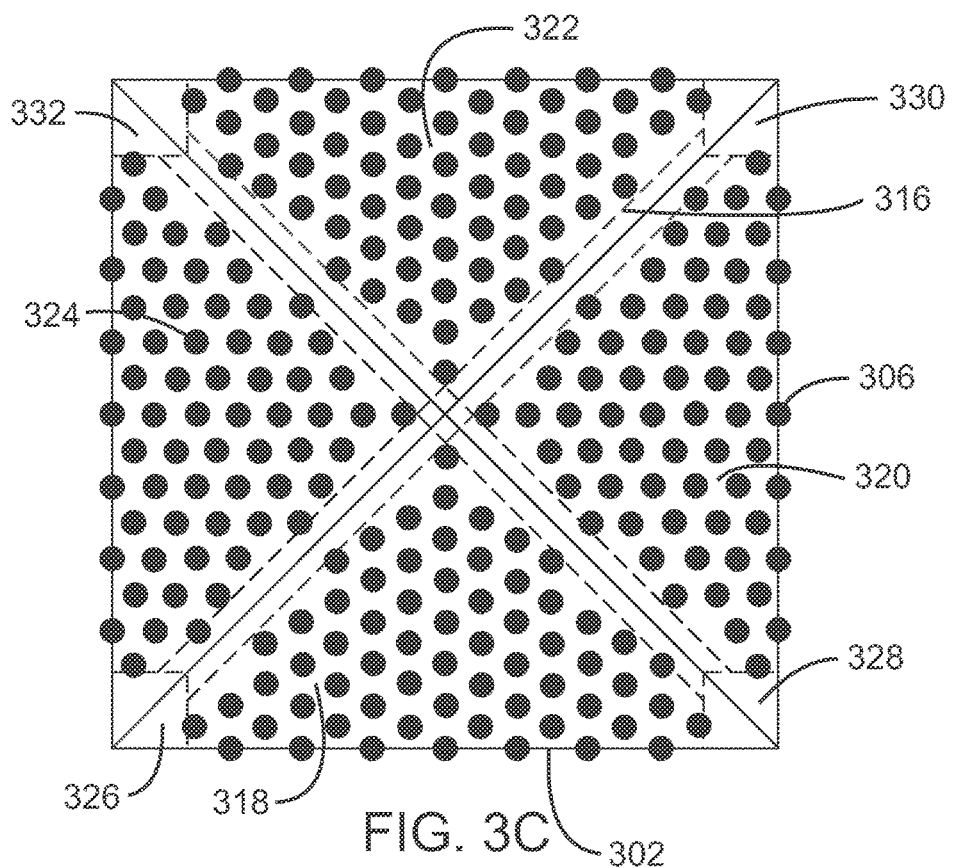
FIG. 3C is an illustration of a partially generated symmetrical pattern derived from a hexagonal pattern, in accordance with embodiments.

FIG. 3C is an illustration of a partially generated symmetrical pattern derived from a hexagonal pattern, in accordance with embodiments. The hexagonal pattern 302 may be copied into the remaining sections 308, 310, and 312 to form hexagonal patterns 318, 320, 322, and 324. The hexagonal patterns 318, 320, 322, and 324 may be exact copies of each other. The copies may be arranged such that hexagonal patterns positioned in opposing sections, such as patterns 318 and 322 and patterns 320 and 324, form mirror images of each other. In another example, hexagonal patterns positioned in adjoining sections may be rotated 90 degrees in relation to the preceding section when travelling clockwise around the perimeter 302. For example, pattern 318 may be rotated 90 degrees in relation to pattern 320. In another example, the sections may be shaped differently from each other, such as in a non-square perimeter 302. In a non-square perimeter 302, the hexagonal patterns 318, 320, 322, and 324 may not be exact copies of each other. For example, the hexagonal patterns 318, 320, 322, and 324 may be individually shaped to fit sections with differing shapes. If the patterns are shaped to sections with differing shapes, circuit connection points within a predefined distance from the inner edges of each section may be removed so that circuit connection points of hexagonal patterns will not interfere with circuit connection points of hexagonal patterns in adjoining sections.

The circuit connection points 306 located within the corners 326, 328, 330, and 332 of perimeter 302 may be removed for falling within a solder joint reliability (SJR) area. In another example, circuit connection points 306 located in the corners 326, 328, 330, and 332 may be extensions of the hexagonal patterns 318, 320, 322, and 324.

Figure 3D:
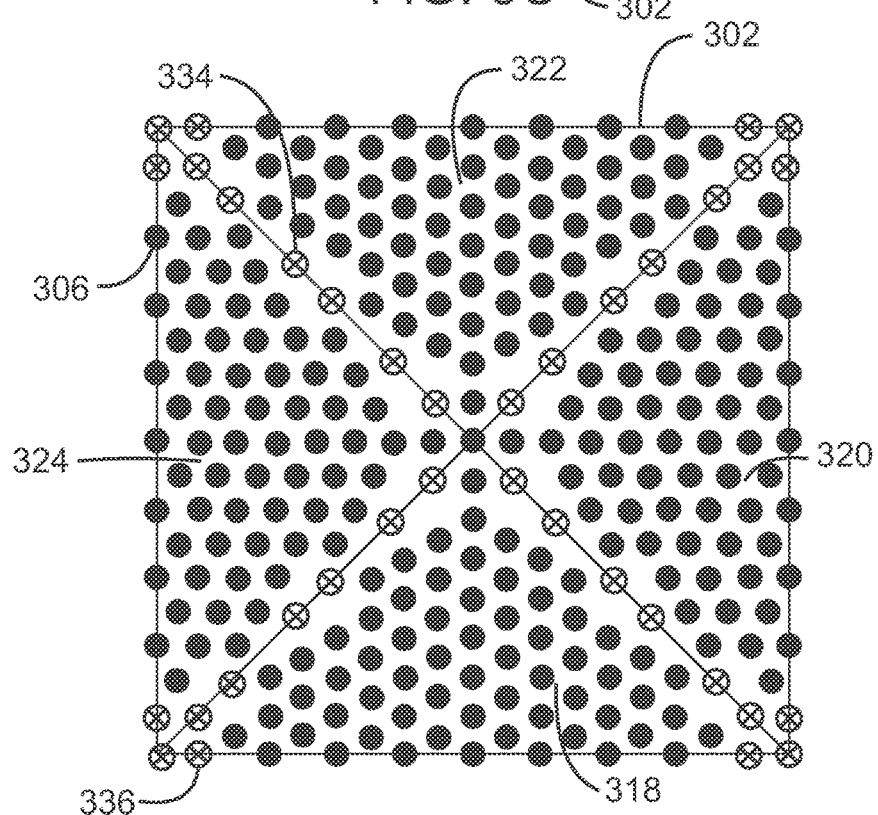
FIG. 3D is an illustration of a generated symmetrical pattern derived from a hexagonal pattern, in accordance with embodiments.

FIG. 3D is an illustration of a generated symmetrical pattern derived from a hexagonal pattern, in accordance with embodiments. The spaces where circuit connection points were removed in previous steps may be filled in. Circuit connection points placed within the spaces 334 between the hexagonal patterns 318, 320, 322, and 324 may maintain a minimum spacing from all surrounding circuit connection points. Circuit connection points may be placed in the empty corners 336 may be placed in a solder joint reliability (SJR) pattern. The SJR pattern may be designed to promote desired design parameters. For example, the SJR pattern may be designed to promote symmetrical mechanical stresses.

Escape routing and density values may vary depending on package size and typically are higher as the package size increases. In embodiments, the symmetrical hexagonal pattern has a higher ball density as compared to a square pattern and to an FCC pattern. For example, an 8×8 mm symmetrical hexagonal pattern may have 101.4% total balls as compared to the 100% balls of an 8×8 mm square pattern and the 91.7% total balls of an FCC pattern. In another example, a 15×15 mm symmetrical hexagonal pattern may have 106.5% total balls as compared to 100% total balls of a 15×15 mm square pattern and 96.4% total balls of an FCC pattern. In addition, the symmetrical hexagonal pattern may have higher escape routing compared to the escape routing of a square pattern and an FCC pattern. For example, an 8×8 mm symmetrical hex pattern may have 114.3% escape routing compared to an escape routing of 100% for an 8×8 mm square pattern and 96.4% escape routing for an 8×8 mm FCC pattern. In another example, a 15×15 mm symmetrical hex pattern may have 115.7% escape routing compared to an escape routing of 100% for a 15×15 mm square pattern and 109.8% escape routing for a 15×15 mm FCC pattern.

The hex pattern may have a higher ball density value compared to the symmetrical hex pattern. For example, an 8×8 mm hex pattern may have 108.3% total balls as compared to 101.4% total balls of an 8×8 mm symmetrical hex pattern. In another example, a 15×15 mm hex pattern may have 111.0% total balls as compared to 106.2% total balls of a 15×15 mm hex pattern. However, a symmetrical hex pattern may have a higher escape routing value than a hex pattern. For example, an 8×8 mm symmetrical hex pattern may have 114.3% escape routing as compared to 108.9% escape routing of an 8×8 mm hex pattern. In another example, a 15×15 mm symmetrical hex pattern may have 115.7% escape routing as compared to 109.8% escape routing of a 15×15 mm hex pattern.

Figure 4:
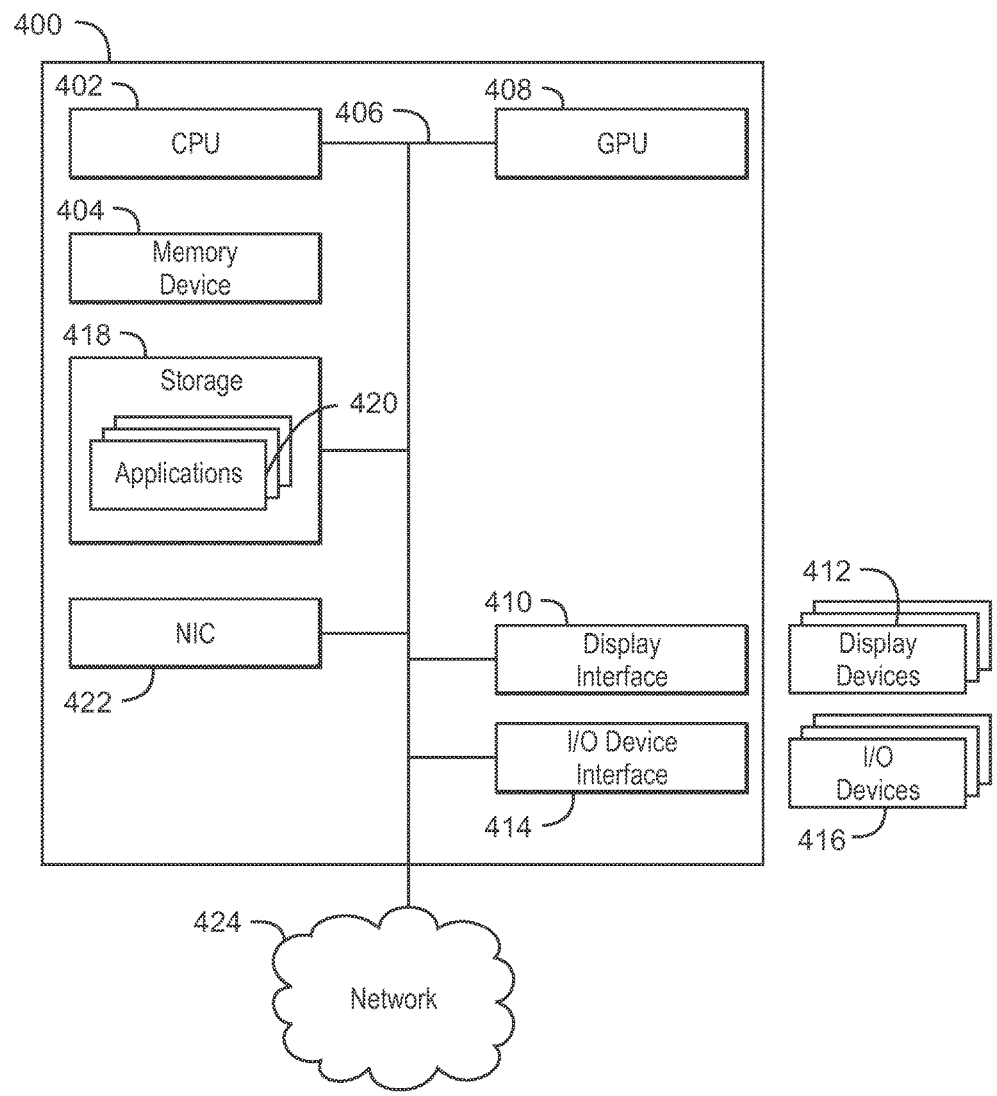
FIG. 4 is a block diagram of a computing device in accordance with embodiments.

FIG. 4 is a block diagram of a computing device 400 in accordance with embodiments. The computing device 400 may be, for example, a laptop computer, desktop computer, tablet computer, mobile device, or server, among others. The computing device 400 may include a central processing unit (CPU) 402 that is configured to execute stored instructions, as well as a memory device 404 that stores instructions that are executable by the CPU 402. The CPU may be attached to a PCB within the computing device 400 using a symmetric hexagonal based BGA pattern, in accordance with embodiments.

The CPU may be coupled to the memory device 404 by a bus 406. Additionally, the CPU 402 can be a single core processor, a multi-core processor, a computing cluster, or any number of other configurations. Furthermore, the computing device 400 may include more than one CPU 402. The computing device 400 may also include a graphics processing unit (GPU) 408. The GPU may also be attached to a PCB using a symmetric hexagonal based BGA pattern, in accordance with embodiments. As shown, the CPU 402 may be coupled through the bus 406 to the GPU 408. The GPU 408 may be configured to perform any number of graphics operations within the computing device 400. For example, the GPU 408 may be configured to render or manipulate graphics images, graphics frames, videos, or the like, to be displayed to a user of the computing device 400. In some embodiments, the GPU 408 includes a number of graphics engines, wherein each graphics engine is configured to perform specific graphics tasks, or to execute specific types of workloads.

The memory device 404 can include random access memory (RAM), read only memory (ROM), flash memory, or any other suitable memory systems. For example, the memory device 404 may include dynamic random access memory (DRAM). The CPU 402 may be linked through the bus 406 to a display interface 410 configured to connect the computing device 400 to a display device 412. The display device 412 may include a display screen that is a built-in component of the computing device 400. The display device 412 may also include a computer monitor, television, or projector, among others, that is externally connected to the computing device 400.

The CPU 402 may also be connected through the bus 406 to an input/output (I/O) device interface 414 configured to connect the computing device 400 to one or more I/O devices 416. The I/O devices 416 may include, for example, a keyboard and a pointing device, wherein the pointing device may include a touchpad or a touchscreen, among others. The I/O devices 416 may be built-in components of the computing device 400, or may be devices that are externally connected to the computing device 400.

The computing device also includes a storage device 418. The storage device 418 is a physical memory such as a hard drive, an optical drive, a thumbdrive, an array of drives, or any combinations thereof. The storage device 418 may also include remote storage drives. The storage device 418 includes any number of applications 420 that are configured to run on the computing device 400. The computing device 400 may also include a network interface controller (NIC)

422 may be configured to connect the computing device 400 through the bus 406 to a network 424. The network 424 may be a wide area network (WAN), local area network (LAN), or the Internet, among others.

The block diagram of FIG. 4 is not intended to indicate that the computing device 400 is to include all of the components shown in FIG. 4. Further, the computing device 400 may include any number of additional components not shown in FIG. 4, depending on the details of the specific implementation. Moreover, any component of FIG. 4 may be attached to a PCB as described above.

Example 1

A ball grid array for an integrated circuit package is described herein. The ball grid array includes a symmetrical pattern of circuit connection points. The symmetrical pattern is derived from a base hexagonal pattern that is repeated in at least one or more sections of the ball grid array.

The circuit connection points may be balls of solder in a ball grid array. The shape of the integrate circuit package may be square and the hexagonal pattern in opposite sections of the square integrated circuit package may be mirror images of each other. The integrated circuit package may further be square and the hexagonal patterns may be oriented such that each hexagonal pattern is rotated ninety degrees when compared to a hexagonal pattern located in an adjacent section located clockwise to a first section. In addition, each hexagonal pattern may include a perimeter edge having the same spacing as a perimeter edge of each remaining hexagonal pattern. The spaces between the hexagonal patterns may be filled in with circuit connection points and the circuit connection points may maintain a minimum spacing from circuit connections points within the hexagonal patterns. The circuit connection points located in corners of the integrated circuit packaging may continue the hexagonal patterns in each section. Each corner of the section of the ball grid array pattern may include a solder joint reliability (SJR) pattern. The SJR pattern may be a pattern other than a hexagonal pattern repeated in sections of a package shape. The hexagonal pattern may be generated at a desired pitch (P). The hexagonal pattern of circuit connection points may be altered such that the circuit connection points are not within a predetermined distance to an edge of the one or more sections.

Example 2

A ball grid array package is described herein. The ball grid array package includes a substrate having a top surface and a bottom surface. The ball grid array package also includes an array of contact pads arranged on the bottom surface of the substrate. The ball grid array package further includes a plurality of solder balls attached to the contact pads. The contact pads and solder balls are arranged in a symmetrical BGA pattern derived from a standard hexagonal pattern.

The ball grid array pattern may include a package shape divided into sections, and a hexagonal pattern may be repeated in each section such that hexagonal patterns in directly opposing sections are mirror images of each other.

Example 3

A system is described herein. The system includes a host computing system. The system also includes a printed circuit board coupled to the host computing system. The system further includes an integrated circuit package coupled to the printed circuit board. The integrated circuit package is coupled to the printed circuit board via solder balls arranged in a ball grid array pattern. The ball grid array pattern comprises a symmetrical pattern derived from a standard hexagonal pattern.

Example 4

A method is described herein. The method includes placing a hexagonal pattern of circuit connection points into a selected portion of an integrated circuit package. The method also includes altering the hexagonal pattern of circuit connection points such that the circuit connection points are not within a predetermined distance to an edge of the portions. The method further includes adding final connection points to a region of the integrated circuit package.

The circuit connection points may be balls of solder in a ball grid array. Altering the hexagonal pattern of circuit connection points may include removing circuit connection points at the corners of the integrated circuit package. Altering the hexagonal pattern of circuit connection points may include removing circuit connection points from corners of the integrate circuit packaging if the circuit connections points fall within a solder joint reliability (SJR) area. The circuit connection points within corners of the integrated circuit packaging may be arranged in a continuation of the portion of the hexagonal pattern. The circuit connection points may be placed in the corners of the package shape in a solder joint reliability (SJR) pattern. The portion of the hexagonal pattern may be positioned in each section such that hexagonal patterns placed in sections directly opposite each other are mirror images. Adding final connection points to a region of the integrated circuit package may include placing circuit connection points between the portions of the hexagonal pattern. Adding final connection points to a region of the integrated circuit package may include placing the circuit connection points so that a minimum spacing is maintained.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

While the present techniques may be susceptible to various modifications and alternative forms, the exemplary examples discussed above have been shown only by way of example. It is to be understood that the technique is not intended to be limited to the particular examples disclosed herein. Indeed, the present techniques include all alternatives, modifications, and equivalents falling within the true spirit and scope of the appended claims.

What is claimed is:

1. A ball grid array for an integrated circuit package, comprising:
a symmetrical pattern of circuit connection points, wherein the symmetrical pattern is derived from a base hexagonal pattern that is repeated in a plurality of sections of the ball grid array and the plurality of sections are separated by lines of demarcation, and wherein the circuit connections points do not occur in an area between the plurality of sections and the integrated circuit package shape is square with the hexagonal patterns oriented such that each hexagonal pattern is rotated ninety degrees when compared to a hexagonal pattern located in an adjacent section located clockwise to a first section.

2. The ball grid array of claim 1, wherein the circuit connection points are balls of solder in a ball grid array.

3. The ball grid array of claim 1, wherein a shape of the integrated circuit package is square and the hexagonal pattern in opposite sections of the square integrated circuit package are mirror images of each other.

4. The ball grid array of claim 1, wherein each hexagonal pattern comprises a perimeter edge having the same spacing as a perimeter edge of each remaining hexagonal pattern.

5. The ball grid array of claim 1, wherein circuit connection points located in corners of the integrated circuit packaging shape continue the hexagonal patterns in each section.

6. The ball grid array of claim 1, wherein each corner of the section of the ball grid array comprises a solder joint reliability (SJR) pattern.

7. The ball grid array of claim 6, wherein the SJR pattern is a pattern other than a hexagonal pattern repeated in sections of a package shape.

8. The ball grid array of claim 1, wherein the hexagonal pattern is generated at a desired pitch (P).

9. The ball grid array of claim 1, wherein the hexagonal pattern of circuit connection points is altered such that the circuit connection points are not within a predetermined distance to an edge of the one or more sections.

10. A ball grid array package, comprising:
a substrate having a top surface and a bottom surface;
an array of contact pads arranged on the bottom surface of the substrate; and
a plurality of solder balls attached to the contact pads, wherein the contact pads and solder balls are arranged in a plurality of sections that are separated by lines of demarcation, and wherein the contact pads and solder balls do not occur in an area between the plurality of sections, and the plurality of sections are oriented such that each section is rotated ninety degrees when compared to an adjacent section located clockwise to a first section.

11. The ball grid array package of claim 10, wherein the ball grid array pattern comprises a package shape divided into sections, and wherein a hexagonal pattern is repeated in each section such that hexagonal patterns in directly opposing sections are mirror images of each other.

12. A system, comprising:
a host computing system;
a printed circuit board coupled to the host computing system; and
an integrated circuit package coupled to the printed circuit board, wherein the integrated circuit package is coupled to the printed circuit board via solder balls arranged in a ball grid array pattern and the ball grid array pattern comprises a plurality of sections that are separated by lines of demarcation, and wherein the solder balls do not occur in an area between the plurality of sections and the plurality of sections are oriented such that each section is rotated ninety degrees when compared to an adjacent section located clockwise to a first section.

13. A method, comprising:
placing a hexagonal pattern of circuit connection points into a selected plurality of portions of an integrated circuit package wherein the plurality of portions are oriented such that that each portion is rotated ninety degrees when compared to an adjacent portion located clockwise to a first portion;
altering the hexagonal pattern of circuit connection points such that the circuit connection points are not within a predetermined distance to an edge of the portions;
and adding final connection points to a region of the integrated circuit package.

14. The method of claim 13, wherein the circuit connection points are balls of solder in a ball grid array.

15. The method of claim 13, wherein altering the hexagonal pattern of circuit connection points comprises removing circuit connection points at the corners of the integrated circuit package.

16. The method of claim 13, wherein altering the hexagonal pattern of circuit connection points comprises removing circuit connection points from corners of the integrated circuit packaging if the circuit connection points fall within a solder joint reliability (SJR) area.

17. The method of claim 13, wherein circuit connection points within corners of the integrated circuit packaging are arranged in a continuation of the portion of the hexagonal pattern.

18. The method of claim 13, wherein the circuit connection points are placed in the corners of the package shape in a solder joint reliability (SJR) pattern.

19. The method of claim 13, wherein the portion of the hexagonal pattern is positioned in each section such that hexagonal patterns placed in sections directly opposite each other are mirror images.

20. The method of claim 14, wherein adding final connection points to a region of the integrated circuit package comprises placing circuit connection points between the portions of the hexagonal pattern.

21. The method of claim 13, wherein adding final connection points to a region of the integrated circuit package comprises placing the circuit connection points so that a minimum spacing is maintained.

22. The ball grid array of claim 1, wherein the symmetrical pattern promotes symmetrical mechanical stresses.

23. The ball grid array package of claim 10, wherein the arrangement of the contact pads and solder balls promotes symmetrical mechanical stresses.

24. The system of claim 12, wherein the arrangement of the contact pads and solder balls promotes symmetrical mechanical stresses.

25. The system of claim 12, wherein a shape of the integrated circuit package is square and the hexagonal pattern in opposite sections of the square integrated circuit package are mirror images of each other.

26. The system of claim 12, wherein each symmetric pattern comprises a perimeter edge having the same spacing as a perimeter edge of each remaining hexagonal pattern.

* * * * *